(12) United States Patent
Chung et al.

(10) Patent No.: US 11,551,857 B2
(45) Date of Patent: Jan. 10, 2023

(54) SHIELDED MAGNETIC DEVICE AND THE METHOD TO MAKE THE SAME

(71) Applicant: CYNTEC CO., LTD., Hsinchu (TW)

(72) Inventors: Min-Feng Chung, Taichung (TW); Meihua Chen, Taoyuan (TW); Po-I Wu, Taipei (TW)

(73) Assignee: CYNTEC CO., LTD., Hsinchu (TW)

(*) Notice: Subject to any disclaimer, the term of this patent is extended or adjusted under 35 U.S.C. 154(b) by 606 days.

(21) Appl. No.: 16/382,204

(22) Filed: Apr. 12, 2019

(65) Prior Publication Data

US 2019/0318868 A1 Oct. 17, 2019

Related U.S. Application Data (60) Provisional application No. 62/685,300, filed on Jun. 15, 2018, provisional application No. 62/657,001, filed on Apr. 13, 2018.

(51) Int. Cl.
| | |
|---|---|
| *H01F 27/36* | (2006.01) |
| *H05K 9/00* | (2006.01) |
| *H01F 27/29* | (2006.01) |
| *H01F 27/32* | (2006.01) |
| *H01F 41/10* | (2006.01) |
| *H01F 41/12* | (2006.01) |

(52) U.S. Cl.
CPC ........... *H01F 27/36* (2013.01); *H01F 27/292* (2013.01); *H01F 27/32* (2013.01); *H01F 41/10* (2013.01); *H01F 41/12* (2013.01); *H05K 9/0018* (2013.01); *H05K 9/0049* (2013.01)

(58) Field of Classification Search
CPC .............................. H01F 27/36; H05K 9/0026
See application file for complete search history.

(56) References Cited

U.S. PATENT DOCUMENTS

| | | | |
|---|---|---|---|
| 6,269,008 B1 * | 7/2001 | Hsu ...................... | H05K 9/0032 |
| | | | 174/353 |
| 2012/0242447 A1 † | 9/2012 | Ichikawa | |
| 2017/0309394 A1 * | 10/2017 | Blow ...................... | H01F 41/02 |
| 2018/0132390 A1 * | 5/2018 | Jeong .................. | H01L 23/3135 |
| 2020/0131405 A1 * | 4/2020 | Gao ........................ | C01B 32/184 |

FOREIGN PATENT DOCUMENTS

CN 204668122 9/2015

OTHER PUBLICATIONS

Machine translation for CN 204668122, specification, 3 pages, translated on May 10, 2022 (Year: 2022).*

* cited by examiner
† cited by third party

*Primary Examiner* — Hung V Ngo
(74) *Attorney, Agent, or Firm* — Litron Patent and Trademark Office; Min-Lee Teng (57) ABSTRACT

At least one shielding layer made of conductive material is formed on a body of a magnetic device to prevent magnetic fields from leaking to the outside of the magnetic device so as to reduce EMI and the size of the magnetic device.

12 Claims, 13 Drawing Sheets

SHIELDED MAGNETIC DEVICE AND THE METHOD TO MAKE THE SAME

CROSS-REFERENCES TO RELATED APPLICATIONS

This application claims the benefit of U.S. Provisional Patent Application No. 62/657,001 filed on Apr. 13, 2018 and 62/685,300 filed on Jun. 15, 2018, which are hereby incorporated by reference herein and made a part of specification.

BACKGROUND OF THE INVENTION

I. Field of the Invention

The present invention relates to a magnetic device, and in particular, to a magnetic device having a shielding layer for reducing EMI.

II. Description of Related Art

As applications of electronic circuits move toward higher frequency and miniaturization, the distance between electronic components of a system becomes closer and closer, as a result, the electromagnetic interference (EMI) problem is becoming more and more serious.

Conventional magnetic devices are often shielded by a metal casing made of a folded plate, which bears higher cost and larger size.

In addition, when a folded plate is used to shield a magnetic device, gaps can exist around the corners of the folded plate, which might cause the magnetic field to leak to the outside of the magnetic device through the gaps, thereby causing an EMI issue in a system.

Therefore, a better solution is needed to resolve the above-mentioned issues.

SUMMARY OF THE INVENTION

One objective of the present invention is to form a shielding layer on a body of a magnetic device to prevent magnetic fields from leaking to the outside of the magnetic device so as to reduce EMI as well as the size of the magnetic device.

One objective of the present invention is to form a plurality of shielding layers on a body of a magnetic device to prevent magnetic fields from leaking to the outside of the magnetic device so as to reduce EMI in both high operating frequency higher than 3 MHz and low operating frequency lower than 3 MHz, wherein the shielding layer made of metal with a high conductivity, such as Cu, is good for shielding high-frequency magnetic field, and the shielding layer made of metal with a high permeability, such as Fe and Ni, is good for shielding low-frequency magnetic field.

In one embodiment of the present invention, a magnetic device is disclosed, wherein the magnetic device comprises: a body; and at least one conductive layer, wherein the at least one conductive layer is formed on the body for shielding the magnetic device, wherein the at least one conductive layer covers at least the top surface of the body.

In one embodiment, the at least conductive layer is made of metal that is electroplated on the body for shielding the magnetic device.

In one embodiment, the at least conductive layer is made of metal that is sputtered on the body for shielding the magnetic device.

In one embodiment, the at least one conductive layer is made of conductive and adhesive material that is coated on the body for shielding the magnetic device.

In one embodiment, wherein the at least one conductive layer comprises a metal layer made of Cu.

In one embodiment, wherein the at least one conductive layer comprises a metal layer made of Fe and Ni.

In one embodiment, wherein the at least one conductive layer comprises a first metal layer made of Cu and a second metal layer made of Fe and Ni, wherein the second metal layer is disposed on the first metal layer.

In one embodiment of the present invention, a magnetic device is disclosed, the magnetic device comprises a body, wherein the body is shielded at least by a material comprising Fe and Ni for shielding the magnetic device.

In one embodiment, the body is encapsulated by a metal layer comprising Fe and Ni, wherein the metal layer is formed on the body.

In one embodiment, the body is encapsulated by a metal casing comprising Fe and Ni.

In one embodiment, the body is encapsulated by a first metal layer made of Cu and a second metal layer made of Fe and Ni.

In one embodiment of the present invention, a magnetic device is disclosed, wherein the magnetic device comprises: a coil; a body, wherein the coil is disposed in the body, wherein the body has a top surface, a bottom surface and a first lateral surface connecting the top surface and the bottom surface; and a conductive casing, disposed on the body for shielding the magnetic device, wherein the conductive casing covers the top surface of the body and extends to lateral surfaces of the body, wherein there is no gap between any two conductive portions of the conductive casing.

In one embodiment, the conductive casing is made of metal.

In one embodiment, the conductive casing comprises a folded plate, wherein two portions of the folded plate are disposed on two adjacent lateral surfaces of the body, respectively, wherein a conductive and adhesive material fills a gap between said two portions of the folded plate.

In one embodiment, the conductive and adhesive material comprises silver glue.

In one embodiment, the conductive and adhesive material comprises a graphene glue.

In one embodiment of the present invention, a magnetic device is disclosed, wherein the magnetic device comprises: a coil; a body, wherein the coil is disposed in the body, wherein the body has a top surface, a bottom surface and a first lateral surface connecting the top surface and the bottom surface; and a conductive casing, disposed on the body for shielding the magnetic device, and a lead frame disposed on a first lateral surface, wherein a total length of an extended length of the conductive layer on the first lateral surface of the body and an extended length of the lead frame on the first lateral surface of the body is greater than 40% of the length of the first lateral surface of the body.

In one embodiment of the present invention, a method for forming a magnetic device is disclosed, wherein the method comprises: providing a magnetic device having a body, and forming at least one conductive layer on the body of the magnetic device for shielding the magnetic device.

In one embodiment of the present invention, a method for forming a magnetic device is disclosed, wherein the method comprises: providing a magnetic device having a body; and forming at least one conductive layer on the body of the magnetic device for shielding the magnetic device, wherein the conductive layer extends from a top surface of the body to a bottom surface of the body for forming an electrode for connecting to a ground.

In one embodiment of the present invention, a method for forming a magnetic device is disclosed, wherein the method comprises: providing a magnetic device having a body and a coil disposed in the body; forming at least one conductive layer on the body of the magnetic device for shielding the magnetic device, wherein the conductive layer extends from a top surface of the body to a bottom surface of the body for forming an electrode for connecting to a ground; and forming two electrodes on the bottom surface of the body that are electrically connected to the coil.

In order to make the aforementioned and other features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
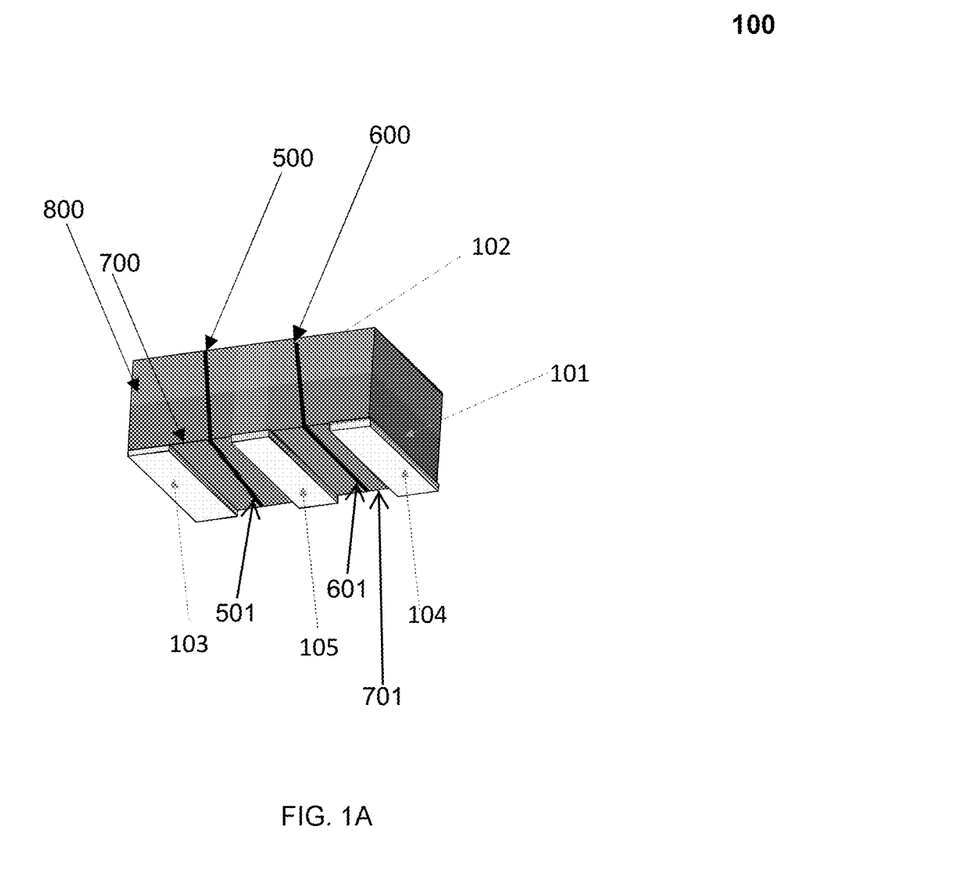
FIG. 1A is an enlarged view illustrating a magnetic device having a shielding layer to encapsulating a body of the magnetic device according to one embodiment of the present invention.

FIG. 1A depicts an enlarged cross-sectional view of a magnetic device 100 according to one embodiment of the present invention, wherein the magnetic device 100 comprises a body 101; and at least one conductive layer 102, wherein the at least one conductive layer 102 is formed on the body 101 for shielding the magnetic device 100 for reducing leakage of magnetic flux generated by the magnetic device 100 so as to reduce electromagnetic interference in a system, wherein the at least one conductive layer 102 covers at least the top surface of the body 101 of the magnetic device 100.

In one embodiment, the at least one conductive layer 102 covers the top surface of the body 101 and extends to at least one lateral surface of the body. As shown in FIG. 1A, a metal layer is made of metal and comprises a first contiguous path 500 that is disposed on the first lateral surface 800 and the bottom surface of the body 101 for shielding the magnetic device 100, wherein the first contiguous path 500 comprises a first seamless portion 501 that is disposed on the bottom surface of the body 101 and extends from a first edge 700 of the bottom surface to a second edge 701 of the bottom surface of the body 101, wherein a first electrode 103, a second electrode 104, and a third electrode 105 are disposed on the bottom surface of the body 101, wherein the third electrode 105 extends from the first edge 700 to the second edge 701 of the bottom surface of the body 101 and is electrically connected to the first seamless portion 501 of the first contiguous path 500, wherein the metal layer further comprises a second contiguous path 600 that is disposed on the first lateral surface 800 and the bottom surface of the body 101, wherein the second contiguous path 600 comprises a second seamless portion 601 that is disposed on the bottom surface of the body 101 and extends from the first edge 700 to the second edge 701 of the bottom surface of the body 101, wherein the third electrode 105 is located between the first seamless portion 501 of the first contiguous path 500 and the second seamless portion 601 of the second contiguous path 600.

Figure 1B:
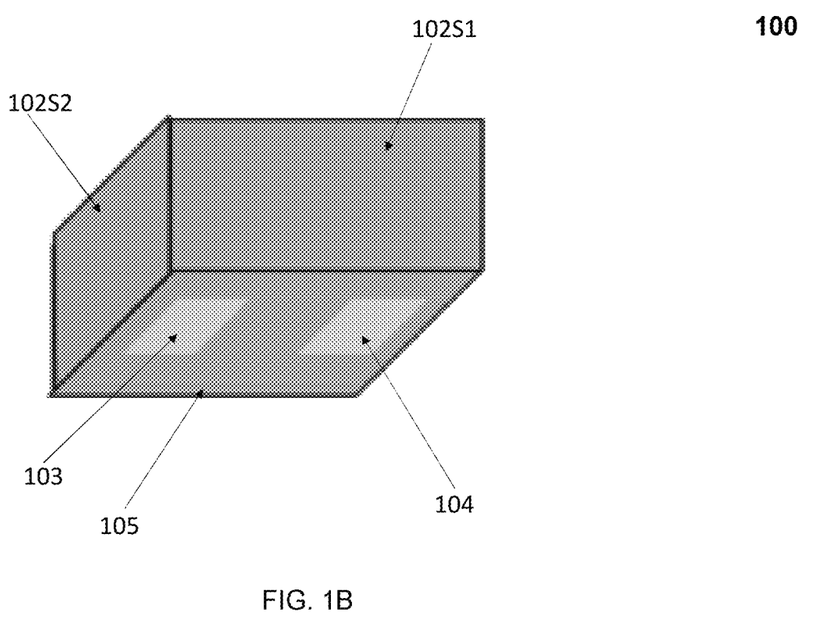
FIG. 1B is an enlarged view illustrating a magnetic device having a shielding layer to encapsulating a body of the magnetic device according to one embodiment of the present invention.

In one embodiment, the at least one conductive layer 102 covers the top surface of the body 101 and extends to a plurality of lateral surfaces 102S1, 102S2 of the body 101, as shown in FIG. 1B.

In one embodiment, the at least conductive layer 102 is made of metal that is electroplated on the body for shielding the magnetic device 100.

In one embodiment, the at least conductive layer 102 is made of metal that is sputtered on the body for shielding the magnetic device 100.

In one embodiment, the at least one conductive layer 102 is made of conductive and adhesive material that is coated on the body for shielding the magnetic device 100.

In one embodiment, the body 101 comprises an insulating layer and a magnetic body, wherein the insulating layer is disposed on the magnetic body, and the at least conductive layer is electroplated on the insulating layer for shielding the magnetic device 100.

In one embodiment, the body comprises an insulating layer and a magnetic body, wherein the insulating layer is disposed on the magnetic body, and the at least one conductive layer is coated on the insulating layer for shielding the magnetic device.

In one embodiment, the body comprises a magnetic body, further comprising a coil disposed in the magnetic body.

In one embodiment, a metal layer made of Fe and Ni is disposed on the insulating layer.

In one embodiment, the at least one conductive layer comprises at least one of the following metal material: Cu, Al, Ni, Fe, Sn and Ag.

In one embodiment, the at least one conductive layer comprises a metal layer made of Fe and Ni.

In one embodiment, the first metal layer comprising Cu has a thickness greater than 5 μm.

In one embodiment, the first metal layer comprising Cu has a thickness between 5 μm to 30 μm.

In one embodiment, the first metal layer comprising Fe and Ni has a thickness greater than 2 μm.

In one embodiment, the first metal layer comprising Fe and Ni has a thickness between 2 μm to 30 μm.

In one embodiment, the first metal layer has a thickness between 10 μm to 20 μm.

In one embodiment, a permeability of the first metal layer is greater than 500.

In one embodiment, the at least one conductive layer comprises at least one of the following magnetic material: ferrite, alloy, Fe and Ni.

In one embodiment, the at least one conductive layer comprises a first metal layer made of Ni and a second metal layer made of Cu, wherein the second metal layer is electroplated on the first metal layer.

In one embodiment, the at least one conductive layer comprises a first metal layer made of Fe and Ni and a second metal layer made of Cu, wherein the second metal layer is electroplated on the first metal layer.

In one embodiment, the at least one conductive layer comprises a first metal layer made of Cu and a second metal layer made of Fe and Ni, wherein the second metal layer is electroplated on the first metal layer.

In one embodiment, the first metal layer made of Cu has a thickness greater than 5 μm and the second metal layer made of Fe and Ni has a thickness greater than 2 μm.

In one embodiment, the first metal layer made of Cu has a thickness between 5 μm-30 μm and the second metal layer made of Fe and Ni has a thickness between 2 μm-30 μm.

In one embodiment, the first metal layer made of Cu has a thickness between 20 μm-30 μm and the second metal layer made of Fe and Ni has a thickness between 10 μm-20 μm.

In one embodiment, a first electrode, a second electrode and a third electrode are disposed on the bottom surface of the body, wherein the first electrode and the second electrode are electrically connected to the coil, and the third electrode is electrically connected to the at least one conductive layer. In one embodiment, the third electrode is located between the first electrode and the second electrode. In one embodiment, the third electrode encompasses an edge of the bottom surface of the body.

Figure 1C:
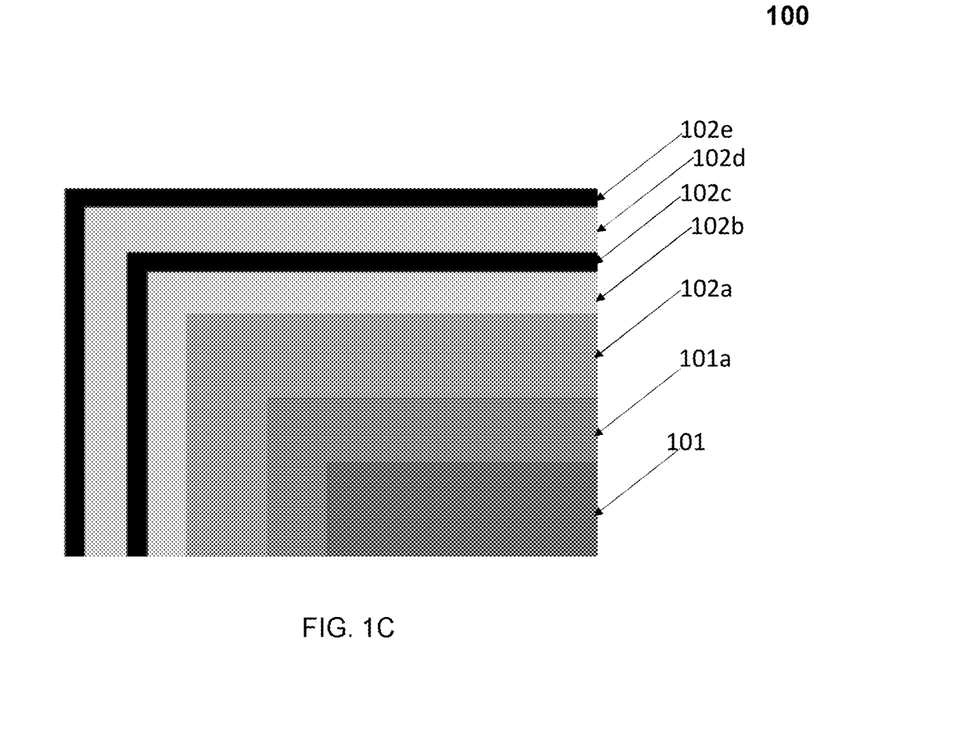
FIG. 1C is a cross-sectional view illustrating a plurality of shielding layers to encapsulating a body of the magnetic device according to one embodiment of the present invention.

FIG. 1C depicts an enlarged cross-sectional view of a magnetic device 100, wherein the magnetic device 100 comprises a body 101; and at least one conductive layer 102, wherein the at least one conductive layer 102 is formed on the body 101 of the magnetic device 100 for shielding the magnetic device 100 for reducing leakage of magnetic flux generated by the magnetic device 100 so as to reduce electromagnetic interference in a system, wherein the at least one conductive layer 102 covers at least the top surface of the body 101 of the magnetic device 100.

In one embodiment, the body 101 is a magnetic body and an insulating layer 101a is disposed on the magnetic body 101, wherein at least one conductive layer 102 is formed on the insulating layer 101a for shielding the magnetic device 100.

In one embodiment, the at least one conductive layer 102 comprises a plurality of conductive layers 102, and the body 101 is a magnetic body, wherein an insulating layer 101a is disposed on the magnetic body 101, wherein the plurality of conductive layers 102 are formed on the insulating layer 101a for shielding the magnetic device.

In one embodiment, a metal layer made of Ag 102a is disposed on the insulating layer 101a.

In one embodiment, a metal layer made of Cu 102b is disposed on the metal layer made of Ag 102a. In one embodiment, a metal layer made of Fe and Ni 102c is disposed on the metal layer made of Cu 102b. In one embodiment, a metal layer made of Cu 102d is disposed on the metal layer made of Fe and Ni 102c. In one embodiment, a metal layer made of Fe and Ni 102e is disposed on the metal layer made of Cu 102d.

In one embodiment, a metal layer made of Cu 102b is disposed on the insulating layer 101a. In one embodiment, a metal layer made of Fe and Ni 102c is disposed on the metal layer made of Cu 102b. In one embodiment, a metal layer made of Cu 102d is disposed on the metal layer made of Fe and Ni 102c. In one embodiment, a metal layer made of Fe and Ni 102e is disposed on the metal layer made of Cu 102d.

In one embodiment, a metal layer made of Fe and Ni 102c is disposed on the insulating layer 101a. In one embodiment, a metal layer made of Cu 102b is disposed on the metal layer made of Fe and Ni 102c. In one embodiment, the metal layer made of Fe and Ni 102e is disposed on the metal layer made of Cu 102b. In one embodiment, the metal layer made of Cu 102d is disposed on the metal layer made of Fe and Ni 102e.

Figure 1D:
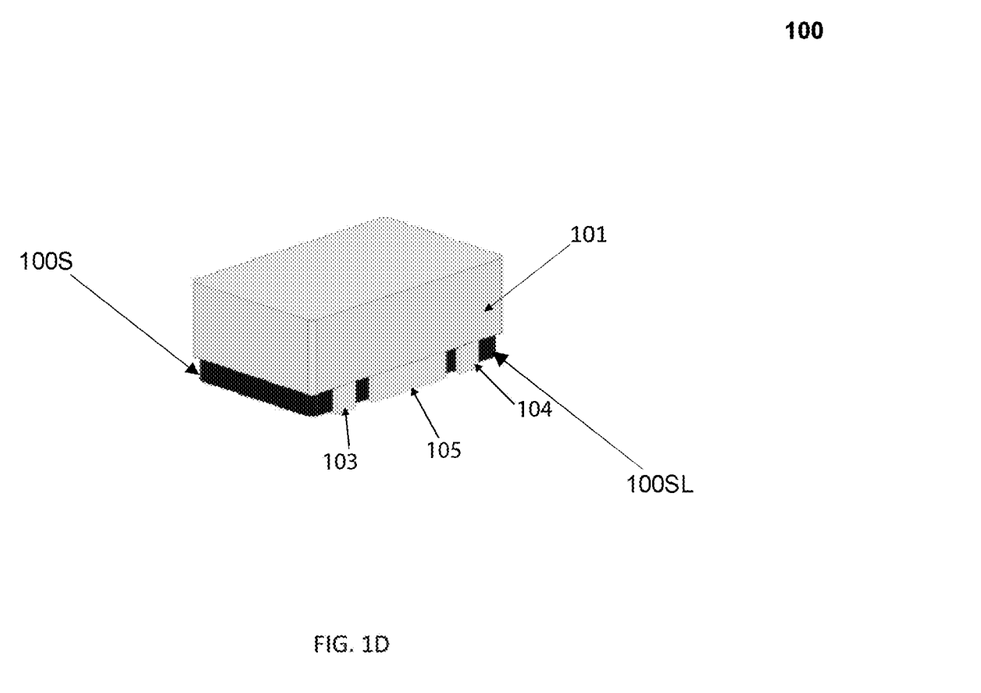
FIG. 1D illustrates an electrode structure of the magnetic device according to one embodiment of the present invention.

FIG. 1D illustrates an electrode structure of a magnetic device according to one embodiment of the present invention. In one embodiment, as shown in FIG. 1D, an electrode structure 100S that disposed on the bottom surface of the body 101 and comprises a first electrode 103, a second electrode 104 and a third electrode 105, wherein the third electrode 105 is electrically connected to the at least one conductive layer for shielding the magnetic device, wherein the third electrode 105 is used for electrically connecting with a ground, and the first electrode 103 and the second electrode 104 are electrically connecting with a coil inside the body 101 of the magnetic device. As shown in FIG. 1D, the thickness of the third electrode 105 can be the same as the thickness of each of the first electrode 103 and the second electrode 104. In one embodiment, the width of the third electrode 105 is greater than the width of each of the first electrode 103 and the second electrode 104, respectively, wherein each said width is measured on a lateral surface 100SL of the electrode structure 100S as shown in FIG. 1D. In one embodiment, the width of the third electrode 105 is at least three times of the width of each of the first electrode 103 and the second electrode 104 for reducing the EMI. In one embodiment, the width of the third electrode 105 is at least four times of the width of each of the first electrode 103 and the second electrode 104 for reducing the EMI. In one embodiment, the width of each of the first electrode 103 and the second electrode 104 is between 0.1 mm and 0.3 mm, and the width of the third electrode 105 is between 0.6 mm and 1.0 mm. In one embodiment, the width of each of the first electrode 103 and the second electrode 104 is 0.2 mm, and the width of the third electrode 105 is 0.8 mm. In one embodiment, the third electrode 105 is located between the first electrode 103 and the second electrode 104. In one embodiment, the thickness of each of the first electrode 103, the second electrode 104 and the third electrode 105 is 0.2 mm.

Figure 1E:
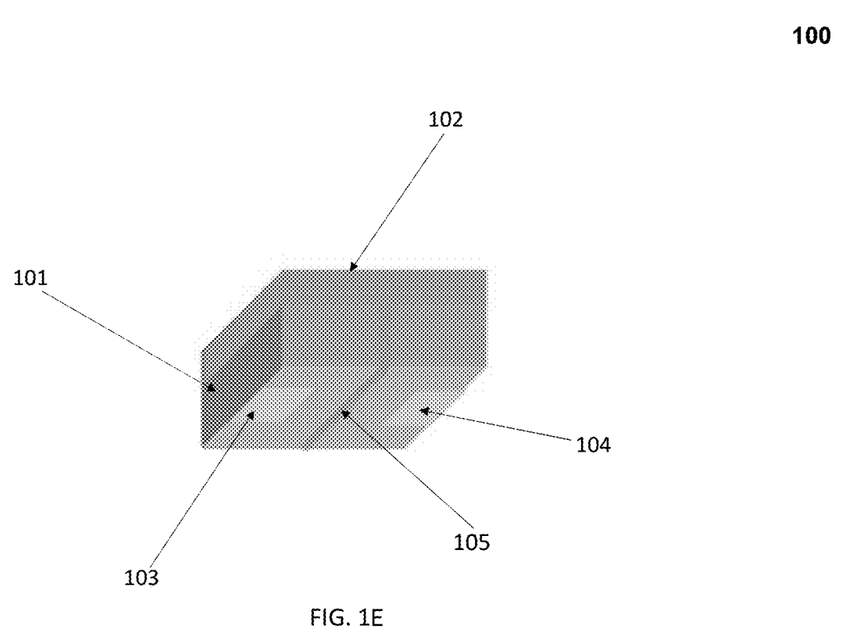
FIG. 1E illustrates an electrode structure of the magnetic device according to one embodiment of the present invention.

FIG. 1E illustrates an electrode structure of a magnetic device according to one embodiment of the present invention. In one embodiment, as shown in FIG. 1E, the first electrode 103 and the second electrode 104 are disposed on the bottom surface of the body 101 and electrically connected to a coil disposed inside the body 101, wherein the at least one conductive layer 102 is extended from the top surface to the bottom surface through a lateral surface of the body 101, wherein an extended portion of the at least one conductive layer that is disposed on the bottom surface of the body can be used to form the third electrode 105 for connecting with a ground.

In one embodiment, a first electrode, a second electrode, a third electrode and a fourth electrode are disposed on the bottom surface of the body, wherein the first electrode and the second electrode are electrically connected to the coil, and the third electrode and the fourth electrode are electrically connected to the at least one conductive layer.

In one embodiment, the body comprises an insulating layer and a magnetic body, wherein the insulating layer is disposed on the magnetic body, and the at least conductive layer is electroplated on the insulating layer for shielding the magnetic device.

In one embodiment, the body comprises an insulating layer and a magnetic body, wherein the insulating layer is disposed on the magnetic body, and the at least one conductive layer is coated on the insulating layer for shielding the magnetic device.

Figure 5A:
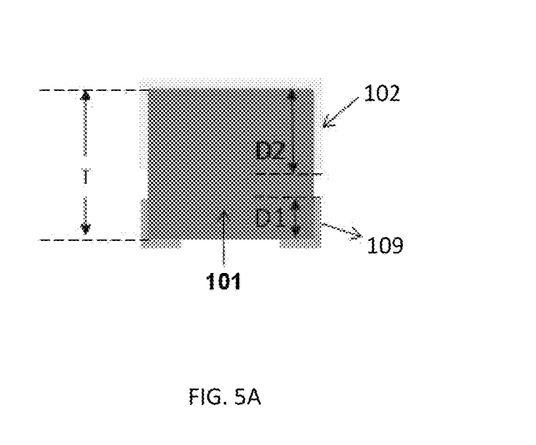
FIG. 5A is an enlarged view illustrating a magnetic device having a lead frame disposed on a body of the magnetic device according to one embodiment of the present invention.
Figure 5B:
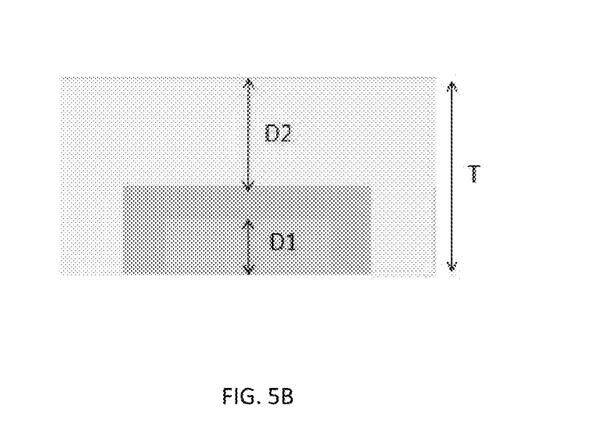
FIG. 5B is an enlarged view illustrating a view of a lateral surface of the body of FIG. 5A according to one embodiment of the present invention.

In one embodiment, as shown in FIG. 5A, a lead frame 109 is disposed on a first lateral surface of the body 101, wherein a total length of an extended length D2 of the conductive layer 102 on the first lateral surface of the body 101 and an extended length D1 of the lead frame 109 on the first lateral surface of the body 101 is greater than 40% of the length T of the first lateral surface of the body 101, as shown in FIG. 5B.

Figure 2A:
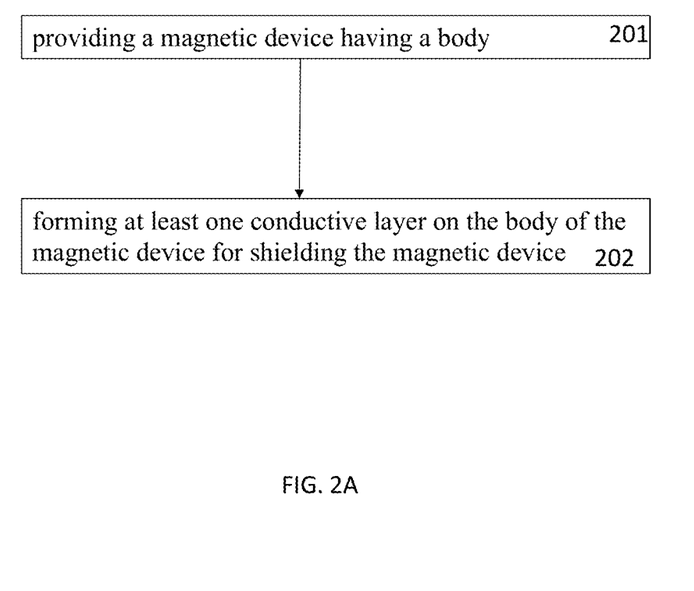
FIG. 2A illustrates a method for forming the magnetic device according to one embodiment of the present invention.

FIG. 2A illustrates a method for forming the magnetic device according to one embodiment of the present invention, wherein the method comprises: in step 201: providing a magnetic device having a body; and instep 202: forming at least one conductive layer on the body of the magnetic device for shielding the magnetic device, wherein the conductive layer extends from a top surface of the body to a bottom surface of the body for forming an electrode for connecting to a ground.

Figure 2B:
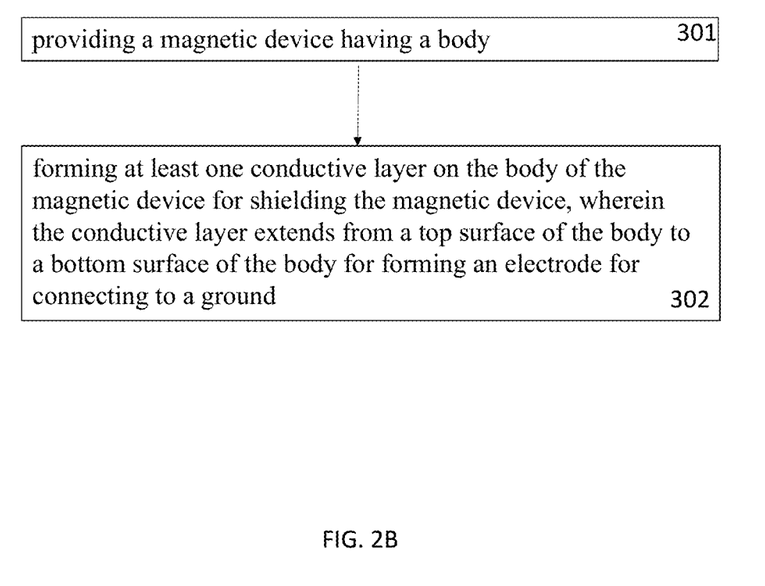
FIG. 2B illustrates a method for forming the magnetic device according to one embodiment of the present invention.

FIG. 2B illustrates a method for forming the magnetic device according to one embodiment of the present invention, wherein the method comprises: in step 301: providing a magnetic device having a body and a coil disposed in the body; in step 302: forming at least one conductive layer on the body of the magnetic device for shielding the magnetic device, wherein the conductive layer extends from a top surface of the body to a bottom surface of the body for forming an electrode for connecting to a ground.

Figure 2C:
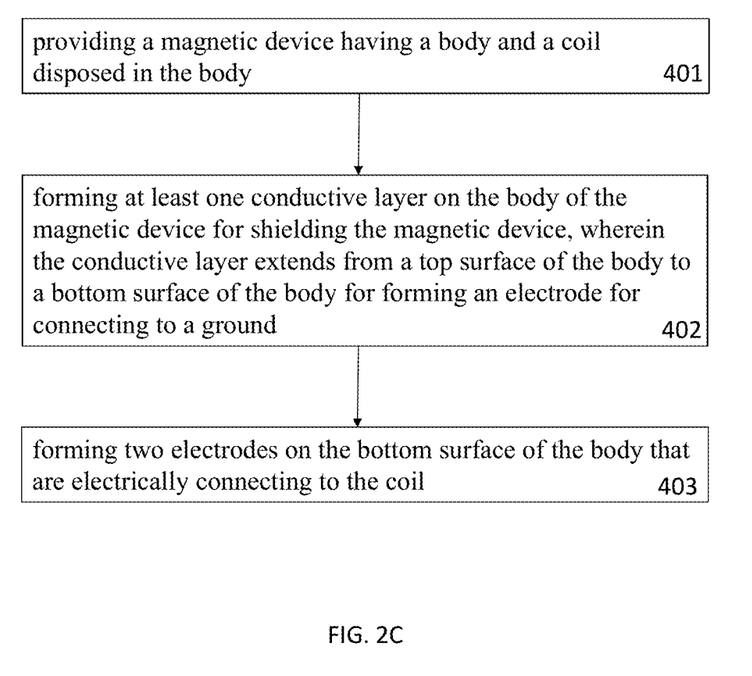
FIG. 2C illustrates a method for forming the magnetic device according to one embodiment of the present invention.

FIG. 2C illustrates a method for forming the magnetic device according to one embodiment of the present invention, wherein the method comprises: in step 401: providing a magnetic device having a body and a coil disposed in the body; in step 402: forming at least one conductive layer on the body of the magnetic device for shielding the magnetic device, wherein the conductive layer extends from a top surface of the body to a bottom surface of the body for forming an electrode for connecting to a ground; and in step 403: forming two electrodes on the bottom surface of the body that are electrically connected to the coil.

Figure 2D:
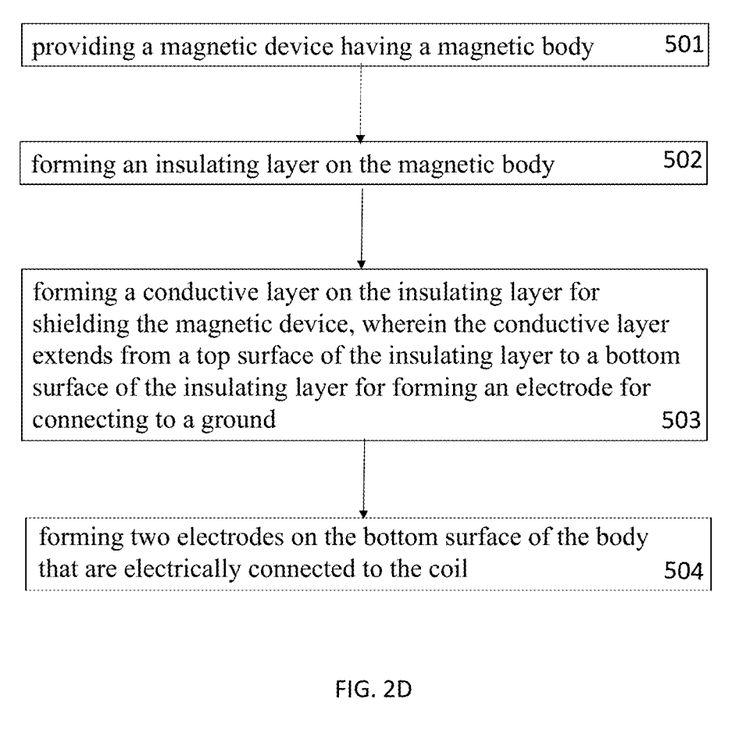
FIG. 2D illustrates a method for forming the magnetic device according to one embodiment of the present invention.

FIG. 2D illustraes a method for forming the magnetic device according to one embodiment of the present invention, wherein the method comprises: in step 501: providing a magnetic device having a magnetic body; in step 502: forming an insulating layer on the magnetic body; and in step 503: forming a conductive layer on the insulating layer for shielding the magnetic device, wherein the conductive layer extends from a top surface of the insulating layer to a bottom surface of the insulating layer for forming an electrode for connecting to a ground; and in step 504: forming two electrodes on the bottom surface of the body that are electrically connected to the coil.

Figure 3:
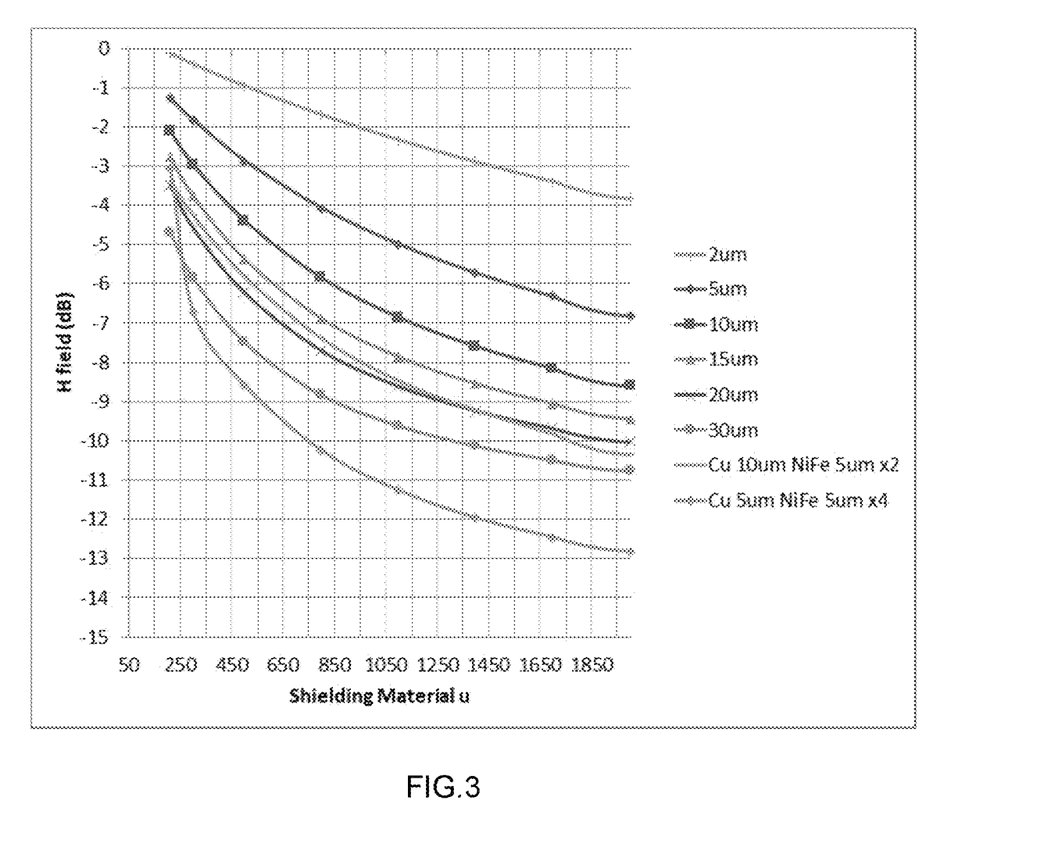
FIG. 3 is a chart to illustrate the leakage level of the magnetic field of the magnetic device based on different shielding layers according to one embodiment of the present invention.

FIG. 3 is a chart to illustrate the leakage level of the magnetic field of the magnetic device based on different shielding layers according to one embodiment of the present invention, wherein the shielding effect can be improved by increasing the thickness of the conductive layer or by increasing the number of the conductive layers.

Figure 4A:
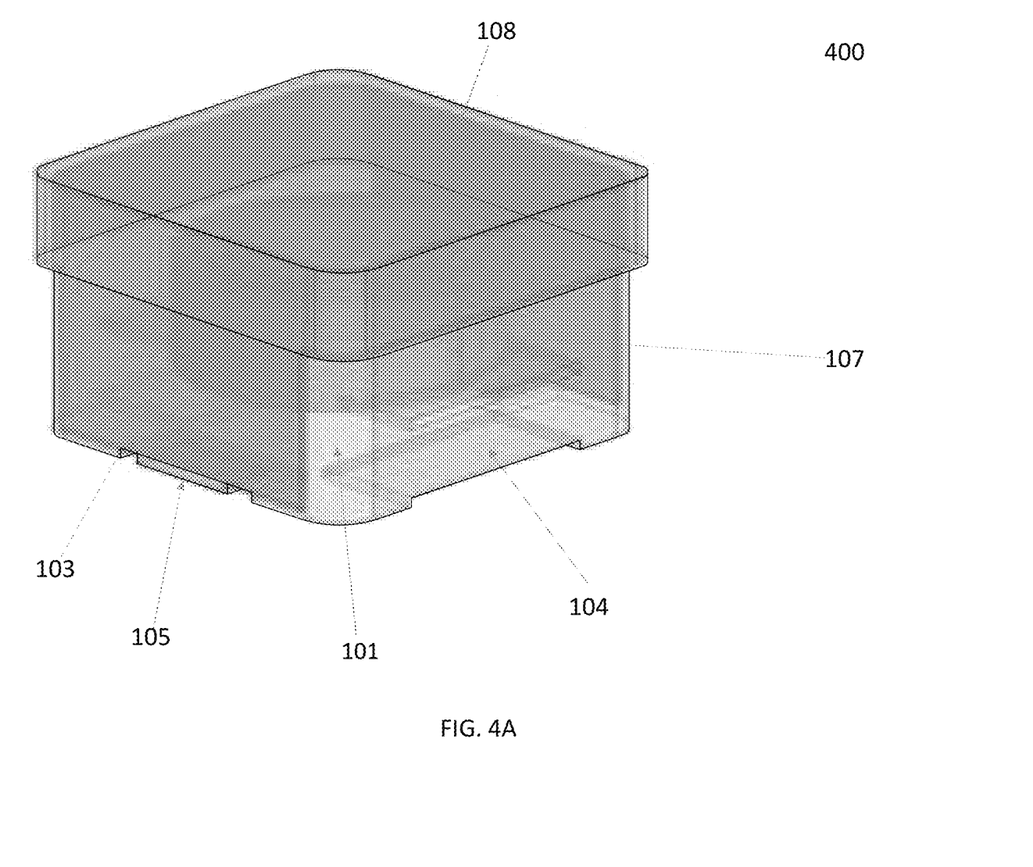
FIG. 4A is an enlarged view illustrating a magnetic device having a metal casing to encapsulating a body of the magnetic device according to one embodiment of the present invention.

FIG. 4A is an enlarged view illustrating a magnetic device having a metal casing to encapsulating a body of the magnetic device according to one embodiment of the present invention, wherein the magnetic device comprises: a coil 107; a body 101, wherein the coil 107 is disposed in the body 101, wherein the body 101 has a top surface, a bottom surface and a plurality of lateral surfaces; and a conductive casing 108, disposed on the body 101 for shielding the magnetic device, wherein the conductive casing 108 covers the top surface of the body and extends to the plurality of lateral surfaces of the body 101, wherein there is no gap between any two conductive portions of the conductive casing.

In one embodiment, the conductive casing is made of metal.

In one embodiment, wherein the conductive casing comprises a folded plate, wherein two portions of the folded plate are disposed on two adjacent lateral surfaces of the body, respectively, wherein a conductive and adhesive material fills a gap between said two portions of the folded plate.

In one embodiment, the conductive and adhesive material comprises a silver glue.

In one embodiment, the conductive and adhesive material comprises a graphene glue.

Figure 4B:
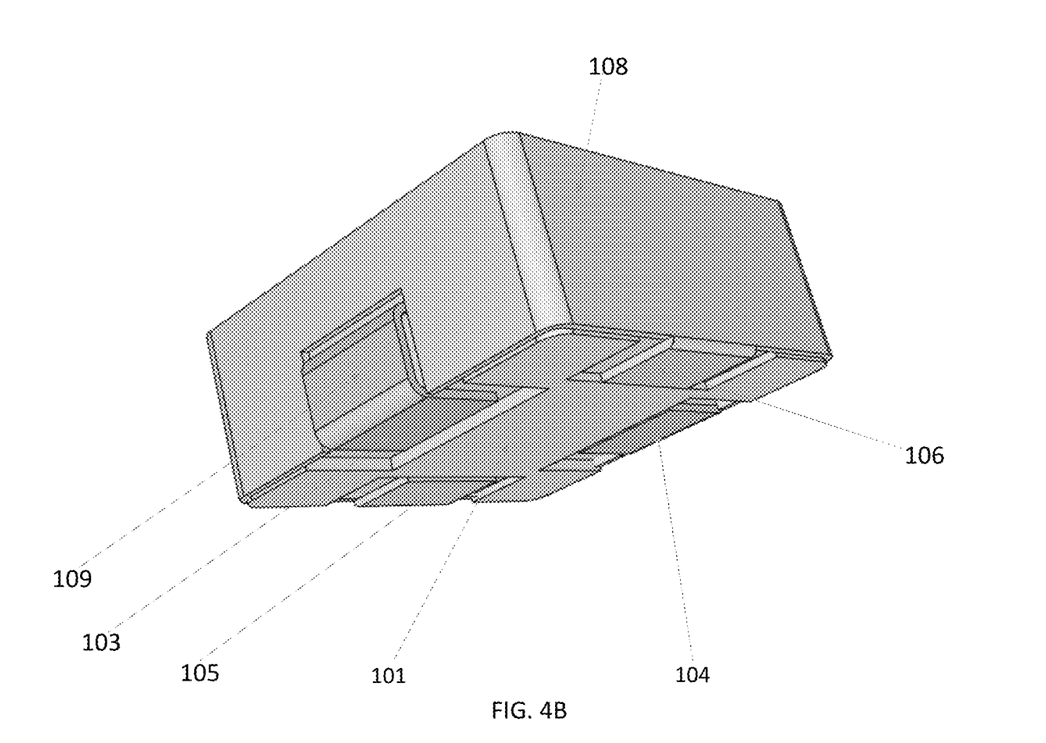
FIG. 4B is an enlarged view illustrating a magnetic device having a metal casing to encapsulating a body of the magnetic device according to one embodiment of the present invention.

FIG. 4B is an enlarged view illustrating a magnetic device having a metal casing to encapsulating a body of the magnetic device according to one embodiment of the present invention, wherein the magnetic device comprises: a coil 107; a body 101, wherein the coil 107 is disposed in the body 101, wherein the body 101 has a top surface, a bottom surface and a first lateral surface connecting the top surface and the bottom surface; and a conductive casing 108, disposed on the body 101 for shielding the magnetic device, and a lead frame 109 disposed on a first lateral surface, wherein a total length of an extended length D1 of the lead frame 109 on the first lateral surface of the body and an extended length D2 of the conductive casing 108 on the first lateral surface of the body is greater than 40% of the length T of the first lateral surface of the body, as shown in FIG. 5B.

In one embodiment, the conductive casing 108 extends from the top surface to a bottom surface of the body 101 for forming an electrode 105 for connecting to a ground; and the lead frame 109 disposed on the body, wherein the lead frame 109 extends from a lateral surface to a bottom surface of the body for forming an electrode 103 that is electrically connected to the coil 108.

In one embodiment, the conductive casing 108 is made of metal that covers the top surface of the body and extends to lateral surfaces of the body, wherein there is no gap between any two portions of the conductive casing 108 made of metal.

In one embodiment, the conductive casing 108 is made of metal, wherein a first electrode, a second electrode and a third electrode are disposed on the bottom surface of the body, wherein the first electrode and the second electrode are electrically connected to the coil, and the third electrode is electrically connected to the conductive casing 108 is made of metal. In one embodiment, the conductive casing 108 made of metal extends to a bottom surface of the body for forming the third electrode.

In one embodiment, the conductive casing 108 is made of metal, wherein a first electrode, a second electrode, a third electrode and a fourth electrode are disposed on the bottom surface of the body, wherein the first electrode and the second electrode are electrically connected to the coil, and each of the third electrode and the fourth electrode is electrically connected to the conductive casing 108 is made of metal. In one embodiment, the conductive casing 108 made of metal extends to a first portion of the bottom surface of the body for forming the third electrode and to a second portion of the bottom surface of the body for forming the fourth electrode.

In one embodiment of the present invention, a magnetic device is disclosed, wherein the magnetic device comprises a body, wherein the body is shielded by a material comprising Fe and Ni for shielding the magnetic device.

In one embodiment, the body is encapsulated by a metal layer comprising Fe and Ni, wherein a metal layer is formed on the body.

In one embodiment, the body is encapsulated by a metal casing comprising Fe and Ni.

Although the present invention has been described with reference to the above embodiments, it will be apparent to one of ordinary skill in the art that modifications to the described embodiment may be made without departing from the spirit of the invention. Accordingly, the scope of the invention will be defined by the attached claims, not by the above-detailed descriptions.

What is claimed is:

1. A magnetic device, comprising:
a body, wherein a coil is disposed in the body; and
a first metal layer, wherein the first metal layer is formed on the body, wherein the first metal layer covers a top surface of the body and extends to four lateral surfaces of the body, wherein the first metal layer is made of metal and comprises a first closed contiguous path that is disposed on a first lateral surface of the body and a bottom surface of the body for shielding the magnetic device, wherein the first contiguous path comprises a first seamless portion that is disposed on the bottom surface of the body and extends from a first edge of the bottom surface to a second edge of the bottom surface, wherein a first electrode, a second electrode, and a third electrode are disposed on the bottom surface of the body, wherein the first electrode and the second electrode are electrically connected to the coil, wherein the third electrode extends from the first edge of the bottom surface to the second edge of the bottom surface and is electrically connected to the first seamless portion of the first contiguous path, wherein the first metal layer further comprises a second contiguous path that is disposed on the first lateral surface and the bottom surface of the body, wherein the second contiguous path comprises a second seamless portion that is disposed on the bottom surface of the body and extends from the first edge of the bottom surface to the second edge of the bottom surface of the body, the third electrode being located between the first seamless portion of the first contiguous path of the first metal layer and the second seamless portion of the second contiguous path of the first metal layer.

2. The magnetic device according to claim 1, wherein the body comprises a magnetic body, wherein the coil is disposed in the magnetic body.

3. The magnetic device according to claim 2, wherein a width of the third electrode is greater than a width of each of the first electrode and the second electrode, respectively.

4. The magnetic device according to claim 2, wherein an insulating layer is disposed on the magnetic body, wherein the first metal layer is formed on the insulating layer for preventing magnetic fields from leaking to the outside of the magnetic device.

5. The magnetic device according to claim 4, wherein the first metal layer is electroplated or sputtered on the insulating layer for preventing magnetic fields from leaking to the outside of the magnetic device.

6. The magnetic device according to claim 1, wherein the first metal layer is electroplated on the body.

7. The magnetic device according to claim 1, wherein the first metal layer is sputtered on the body.

8. The magnetic device according to claim 1, wherein the first metal layer is made of at least one of the following metal materials: Cu, Al, Ni, Fe, Sn and Ag.

9. The magnetic device according to claim 1, further comprising a second metal layer disposed on the first metal layer, wherein the first metal layer and the second metal layer are made of different metal materials.

10. The magnetic device according to claim 9, wherein the first metal layer is made of Cu and the second metal layer is made of Fe and Ni.

11. The magnetic device according to claim 1, wherein the first electrode extends from the first edge of the bottom surface to the second edge of the bottom surface of the body with the first seamless portion of the first contiguous path of the first metal layer being located between the first electrode and the third electrode.

12. The magnetic device according to claim 11, wherein the second electrode extends from the first edge of the bottom surface to the second edge of the bottom surface of the body with the second seamless portion of the second contiguous path of the first metal layer being located between the second electrode and the third electrode.

* * * * *